(12) United States Patent
Pschenitzka et al.

(10) Patent No.: US 11,834,581 B2
(45) Date of Patent: *Dec. 5, 2023

(54) QUANTUM DOT MATERIAL AND METHOD OF CURING

(71) Applicant: Kateeva, Inc., Newark, CA (US)

(72) Inventors: Florian Pschenitzka, San Francisco, CA (US); Michael Morse, San Jose, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/069,731

(22) Filed: Dec. 21, 2022

(65) Prior Publication Data
US 2023/0128544 A1   Apr. 27, 2023

Related U.S. Application Data

(60) Continuation of application No. 17/302,859, filed on May 13, 2021, now Pat. No. 11,597,849, which is a
(Continued)

(51) Int. Cl.
| | |
|---|---|
| *C09D 11/38* | (2014.01) |
| *C09D 11/101* | (2014.01) |
| *C09D 11/52* | (2014.01) |
| *C08L 33/08* | (2006.01) |

(Continued)

(52) U.S. Cl.
CPC .............. *C09D 11/38* (2013.01); *C08L 33/08* (2013.01); *C09D 11/101* (2013.01); *H10K 71/135* (2023.02); *B82Y 20/00* (2013.01); *B82Y 30/00* (2013.01); *C08K 3/013* (2018.01); *C08K 5/0025* (2013.01); *C08K 5/14* (2013.01);
(Continued)

(58) Field of Classification Search
CPC ....... C09D 11/38; C09D 11/101; C09D 11/52; C09D 133/06; C08L 33/08; C08L 2312/00; C08L 2312/06; H10K 71/135; B82Y 20/00; B82Y 30/00; C08K 3/013; C08K 5/0025; C08K 5/14; C08K 2003/2241
See application file for complete search history.

(56) References Cited

U.S. PATENT DOCUMENTS 6,461,419 B1 * 10/2002 Wu ...................... C09D 11/101
                                                                106/31.86
11,155,728 B2    10/2021 Pschenitzka et al.
(Continued)

OTHER PUBLICATIONS

Notice of Allowance dated Nov. 15, 2022 to U.S. Appl. No. 17/302,859.
(Continued)

*Primary Examiner* — Yaovi M Ameh
(74) *Attorney, Agent, or Firm* — Hauptman Ham, LLP

(57) ABSTRACT

Print materials described herein include a first polymerization initiator comprising an initiator material having a thermal decomposition rate and a peak photo-initiated decomposition rate, wherein the thermal dissociation rate is higher than the peak photo-initiated decomposition rate; a vinylic monomer; a polyfunctional monomer; scattering particles; and quantum dots. Methods of making a quantum dot material using such print materials, and of incorporating into light emitting devices, are also described.

20 Claims, 5 Drawing Sheets

Related U.S. Application Data division of application No. 16/706,040, filed on Dec. 6, 2019, now Pat. No. 11,155,728.

(60) Provisional application No. 62/775,952, filed on Dec. 6, 2018.

(51) Int. Cl.

| | |
|---|---|
| *H10K 71/13* | (2023.01) |
| *C08K 5/14* | (2006.01) |
| *C08K 5/00* | (2006.01) |
| *C08K 3/22* | (2006.01) |
| *B82Y 20/00* | (2011.01) |
| *C09D 133/06* | (2006.01) |
| *C08K 3/013* | (2018.01) |
| *B82Y 30/00* | (2011.01) |

(52) U.S. Cl.
CPC .. *C08K 2003/2241* (2013.01); *C08L 2312/00* (2013.01); *C08L 2312/06* (2013.01); *C09D 11/52* (2013.01); *C09D 133/06* (2013.01)

(56) References Cited

U.S. PATENT DOCUMENTS

| | | | |
|---|---|---|---|
| 11,597,849 B2* | 3/2023 | Pschenitzka | C09D 11/38 |
| 2002/0164368 A1 | 11/2002 | Zimmerman | |
| 2005/0069718 A1* | 3/2005 | Voss-Kehl | B82Y 30/00 |
| | | | 428/447 |
| 2010/0076108 A1 | 3/2010 | Miyashita et al. | |
| 2010/0164368 A1 | 7/2010 | Kong et al. | |
| 2011/0008547 A1* | 1/2011 | Grant | B41J 2/01 |
| | | | 427/500 |
| 2015/0255737 A1 | 9/2015 | Moro et al. | |
| 2017/0010398 A1* | 1/2017 | Ishikawa | C09K 19/588 |
| 2018/0309061 A1 | 10/2018 | Chun et al. | |
| 2021/0261805 A1 | 8/2021 | Pschenitzka et al. | |

OTHER PUBLICATIONS

Notice of Allowance dated Jun. 11, 2021 to U.S. Appl. No. 16/706,040.

* cited by examiner

QUANTUM DOT MATERIAL AND METHOD OF CURING

CROSS-REFERENCE TO RELATED APPLICATIONS

This application is a continuation of U.S. patent application Ser. No. 17/302,859, filed May 13, 2021, which is a divisional of U.S. patent application Ser. No. 16/706,040, filed Dec. 6, 2019, now U.S. Pat. No. 11,155,728, issued Oct. 26, 2021, which claims benefit of U.S. Provisional Patent Application Ser. No. 62/775,952, filed Dec. 6, 2018, each of which is incorporated herein by reference in its entirety.

FIELD

This disclosure relates to precision deposition of liquid media on substrates.

BACKGROUND

Inkjet printing is a technique useful for depositing small drop of material at precise locations on a substrate. Aspects of inkjet printing technologies include processes associated with depositing a drop of print material, or ink, at an appropriate location on a substrate by monitoring substrate position, distance between a printhead and the substrate, relative rates of motion between the printhead and the substrate, regulating viscosity of the print material prior to deposition, adjusting the pressure of the print material prior to deposition of drop, and the timing of actuating an orifice in order to produce a drop having an appropriate size to cover a designated area of the substrate.

Inkjet printing is useful in depositing materials on sub-regions of pixels of electronic or computer displays. Aspects of the present disclosure relate to methods and materials associated with inkjet printing of computer display substrates.

SUMMARY

Embodiments described herein provide a print material, comprising a vinylic monomer; a polyfunctional monomer; scattering particles; quantum dots; and a first polymerization initiator and a second polymerization initiator, wherein during a first curing process the first polymerization initiator has a higher decomposition rate than the second polymerization initiator, and during a second curing process the second polymerization initiator has a higher decomposition rate than the first polymerization initiator.

Other embodiments described herein provide a method of forming a quantum dot material, comprising depositing a print material onto a substrate, the print material comprising: a first polymerization initiator comprising a first initiator material having a first decomposition rate during a thermal initiation process and a second decomposition rate during a photo-initiation process, wherein the first decomposition rate is higher than the second decomposition rate; a second polymerization initiator comprising a second initiator material having a third decomposition rate during the thermal initiation process and a fourth decomposition rate during the photo-initiation process, wherein the third decomposition rate is less than the fourth decomposition rate; a vinylic monomer; a polyfunctional monomer; scattering particles; and quantum dots; and subsequently processing the deposited print material.

Other embodiments described herein provide a quantum dot material, comprising a polymer matrix comprising polymerized vinylic monomers; a dispersion of quantum dots; a dispersion of scattering particles; and a residue of at least two initiator materials.

Other embodiments described herein provide a display device made by a method, comprising: depositing a print material onto a substrate, the print material comprising: a polymerization initiator comprising an initiator material having a thermal decomposition rate and a peak photo-initiated decomposition rate, wherein the thermal decomposition rate is higher than the peak photo-initiated decomposition rate; a vinylic monomer; a polyfunctional monomer; scattering particles; and quantum dots; and subsequently processing the deposited print material.

Other embodiments described herein provide a print material, comprising a vinylic monomer; a polyfunctional monomer; scattering particles; quantum dots; and a first polymerization initiator and a second polymerization initiator, wherein during a first curing process comprising a photo-initiated polymerization process using a radiation wavelength less than 400 nm the first polymerization initiator has a higher decomposition rate than the second polymerization initiator, during a second curing process free of activating radiation the second polymerization initiator has a higher decomposition rate than the first polymerization initiator, and the print material retains at least 85% of an initial mass of the print material after the second curing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
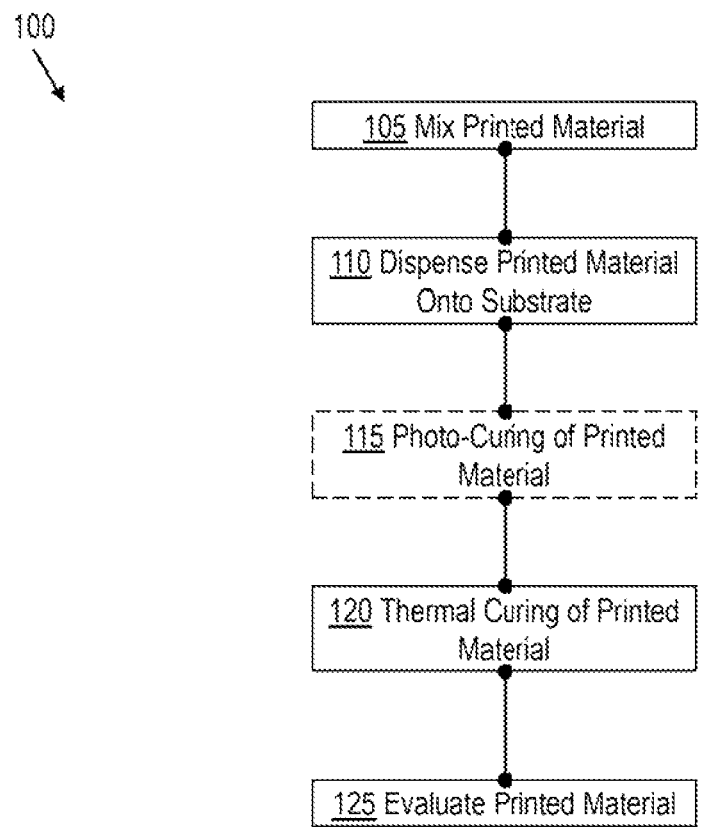
FIG. 1 is a flow diagram of a method of printing quantum dot materials in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During a process for manufacturing pixelated displays, including flat or curved displays, some manufacturing processes deposit spots of print material on a print surface, or top surface, of a substrate in order to form quantum dot materials for the screen or display. In one general design, quantum dot materials are used to convert light from one wavelength to another. A light-emitting element emits, for example, blue light, and quantum dots convert the blue light to red or green light, depending on the quantum dots used. In this way, red, green, and blue pixels can be configured on a substrate by patterned deposition of quantum dots over a light-emitting component.

Quantum dots are small particles of semiconductor material that emit light at a wavelength that is related to the dimensions of the quantum dot particle emitting the light upon stimulus from a photon or electron. Some quantum dots absorb incident light and convert the incident light, having a first wavelength, to emitted light having a second wavelength. The optoelectronic properties of quantum dots can depend on the size of the quantum dot particles. In general, quantum dots having a larger particle size emit longer-wavelength light, and quantum dots having a smaller particle size emit shorter-wavelength light. For example, in some embodiments, quantum dots with diameters ranging from 5 to 6 nm emit red and/or orange light, while quantum dots with diameters between 2 to 3 nm emit shorter wavelength light having blue or green color. Quantum dots can be sized to emit light at various wavelengths in the visible and UV spectrum. Quantum dots include particles made of Group IV semiconductor materials, Group III-V semiconductor compounds, Group II-VI semiconductor compounds, and perovskite compounds. Example semiconductor materials include Si, Ge, SiGe, InP, ZnS, ZnSe, CdSe, and CdS. Perovskite compounds include materials having a same type of crystal structure as calcium titanium oxide ($CaTiO_3$), also known as the perovskite structure, with oxygen at edge centers of unit cells of the perovskite structure. Example perovskite materials include, but are not limited to: strontium titanate ($SrTiO_3$), lead titanate ($PbTiO_3$), bismuth ferrite ($BiFeO_3$), lanthanum ytterbium oxide ($LaYbO_3$), silicate perovskite ($MgSiO_3$, $FeSiO_3$, and/or $CaSiO_3$), lanthanum manganite ($LaMnO_3$), and ytterbium aluminate ($YAlO_3$).

The small size of quantum dot particles allows the dots to be suspended in a host material. A liquid suspension of quantum dot particles, such as liquid print material, has light-converting properties, as does a distribution of quantum dot particles in a quantum dot material formed of a cured print material. Thus, quantum dot particles can be deposited on a substrate for a display, as pixels of the display, or sub-elements of the pixels. A pixel of a display typically contains three color elements: red, blue, and green. In an embodiment of a display, a light emitting component, such as a light-emitting diode, that emits multiple wavelengths of blue light is used as a light source, and each pixel contains three sub-regions: a first sub-region where blue light emerges without wavelength alteration; a second sub-region where quantum dot particles absorb the light from the light source and emit light having a green color, and a third sub-region, where quantum dot particles absorb the light from the light source and emit light having a red color. In some embodiments, the light emitting component is an organic light emitting diode (OLED). The light-emitting component is typically positioned to emit light into a region containing the quantum dots, or in the case of a blue pixel or sub-region, having no quantum dots. The region that configures the light by wavelength is sometimes called a "color-filter" region. Other types of "color-filter" regions merely reduce the intensity of incident light by absorbing and/or scattering a portion of the incident light. The position, shape, and spacing of the pixels of the display, and of the sub-regions of the pixels, is typically configured to achieve a desired resolution and/or image quality.

One method of making sub-regions containing a dispersion of quantum dot particles is to use ink-jet printing techniques to deposit small drops of liquid print material containing a suspension of quantum dots onto a print surface of a substrate. For purposes of the discussion below, liquid print material is released from a print head to form a drop of print material above the print surface. When the liquid print material contacts the print surface of the substrate, the material is said to have been printed.

Ink-jet printing techniques are advantageous for making displays. In some instances, ink-jet printing techniques involve using multiple print heads to deposit multiple types of print material onto a print surface of a substrate. Some ink-jet printing techniques allow for deposition of sub-regions of a pixel without the additional steps of masking a print surface, and removing the mask after the print material is deposited. In some embodiments, an ink-jet printing device is configured with multiple print heads in order to deposit multiple types of print material on a substrate during a single pass of the print heads over the print surface of the substrate.

A spot of print material is subjected to additional processing, including one or more curing processes and/or drying processes, to polymerize, set, and/or harden components of the spot. The cured spot is able to withstand subsequent handling and processing of a display. Once deposited, liquid print material is cured by a curing process, wherein some components of the liquid print material polymerize to harden the print material on the print surface. Curing occurs by thermal stimulation, photo stimulation, or a combination of thermal and photo stimulation steps. Some forms of liquid print material include solvents that are not present in cured print material. Curing print material can induce strain or stress in the cured print material. Strain in cured materials sometimes results in a material with an uneven surface texture or other non-uniform performance parameter.

FIG. 1 is a flow diagram of a method 100 of making a cured spot of print material on a surface of a substrate, according to one embodiment. Presented in conjunction with the discussion of the flow diagram in FIG. 1, FIGS. 2A-2F are diagrams of a spot of printed material during a manufacturing process. In operation 105, the print material to be deposited on the substrate is mixed. Here, the print material includes at least one polymerization initiator, one or more monomers that are stimulated to polymerize by the polymerization initiator, quantum dots to convert incident light having a first wavelength into emitted light having a second wavelength, and scattering particles. Scattering particles promote absorption of the incident light by the quantum dots by scattering the incident light within a spot of cured print material, and promote scattering of outgoing light to increase the viewing angle of the display for a user.

Polymerization initiators include materials having a propensity for both thermally-initiated and photo-initiated polymerization. Some polymerization initiators are materials with a high thermal decomposition rate and a lower photo-initiated decomposition rate. Some polymerization initiators are materials with lower thermal decomposition rates and higher photo-initiated decomposition rates. For some polymerization initiators, the rates of photo and thermal decomposition are approximately the same. In the present disclosure, print material includes one or more polymerization initiators to cure spots of print material on a print surface.

Polymerization initiators are configured to cure the print material by initiating free radical polymerization, where the initiator undergoes hemolytic bond cleavage to form free radical species in the print material, cationic polymerization, where, e.g., an alkene monomer reacts with the electrophilic polymerization initiator, or anionic polymerization, where an anion in the print material forms a chemical bond with a vinyl functional group and generates a new anion to continue the reaction. Some examples of polymerization initiators include azo compounds such as 2,2'-azobisisobutyronitrile (AIBN), 1,1'-azobis(cyclohexanecarbonitrile) (AICN), 2,2'-azobis(4-methoxy-2,4-dimethylvaleronitrile), 2,2'-azobis(2,4-dimethylvaleronitrile), 2,2'-azobis(2-methylbutyronitrile), dimethyl 2,2'-azobis(2-methylpropionate), and 2,2'-azobis(n-butyl-2-methylpropionamide); and peroxide compounds such as t-amyl peroxybenzoate, t-butyl peracetate, t-butyl peroxybenzoate, 2,2-bis(t-butylperoxy)butane, and 2,4-pentanedione peroxide. Some examples of radical initiators include organic peroxide compounds such as dibenzoyl peroxide, dicumyl peroxide, and so forth, epoxide compounds, such as peroxyl ester, or perbenzoic acid, and so forth, or perester compounds. According to some embodiments, polymerization initiators that decompose more quickly under photo-initiation conditions have strong spectroscopic absorbance peaks with $\lambda_{max}$<400 nm and absorbance peaks that are approximately 5-10 nm in width, although other peak widths are also associated with strong photo-initiated decomposition. Strong absorbance peaks indicate that the photoinitiator compounds demonstrate efficient absorption of ultraviolet light to undergo photo-induced decomposition. In one non-limiting embodiment, AIBN is a photoinitiator compound having a strong $\lambda_{max}$=360 nm that undergoes hemolytic C—N bond scission adjacent to the N═N double bond, producing $N_2$ gas and two tert-butyl radicals to trigger radical-based polymerization processes in a print material.

Uncured print material includes crosslinking agents to connect multiple chains together, and matrix monomers, which constitute the bulk of the length of polymer chains. Vinylic monomers contain one or more carbon-carbon double bonds and are either monofunctional or polyfunctional. The vinyl monomers can be linear, branched, cyclic, conjugated, aromatic, or aliphatic, and may contain hetero-atoms in some cases. Examples of types of molecules that may serve as monomers include mono- or polyfunctional styrenic compounds and mono- or polyfunctional acrylates. (Meth)acrylate compounds, including mono (meth)acrylates, di(meth)acrylates, tri(meth)acrylates, and tetra(meth)acrylates are usable. Comonomer systems can also be used to make a suitable polymer matrix. Comonomer systems such as acid/alcohol (polyester), amine/alcohol (polyurethane), amine/anhydride (polyimide), and dichlorosilane/water (silicone) can be used to make an optically clear polymer matrix to support a dispersion of quantum dots and/or scattering particles on a print surface. A non-limiting example of a polyfunctional monomer, or polyfunctional vinylic monomer, includes pentaerythritol tetraacrylate, a tetrafunctional monomer that cross-links polymer chains in a print material.

Examples of usable (meth)acrylate monomers include alkyl or aryl (meth)acrylates, such as methyl (meth)acrylate, ethyl (meth)acrylate, and benzyl (meth)acrylate (BMA); cyclic trimethylolpropane formal (meth)acrylate; alkoxylated tetrahydrofurfuryl (meth)acrylate; phenoxyalkyl (meth) acrylates, such as 2-phenoxyethyl (meth)acrylate and phenoxymethyl (meth) acrylate; 2(2-ethoxyethoxy)ethyl (meth)acrylate. Other suitable di(meth)acrylate monomers include 1,6-hexanediol diacrylate, 1,12 dodecanediol di(meth)acrylate; 1,3-butylene glycol di(meth)acrylate; di(ethylene glycol) methyl ether methacrylate; polyethylene glycol di(meth)acrylate monomers, including ethylene glycol di(meth)acrylate monomers and polyethylene glycol di(meth)acrylate monomers having a number average molecular weight in the range from, for example, about 230 g/mole to about 440 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

Generally, useable di(meth)acrylate monomers are alkoxylated aliphatic di(meth)acrylate monomers. For example, neopentyl glycol di(meth)acrylates, including alkoxylated neopentyl glycol diacrylates, such as neopentyl glycol propoxylate di(meth)acrylate and neopentyl glycol ethoxylate di(meth)acrylate, can be used. The neopentyl glycol di(meth)acrylate monomers have molecular weight from about 200 g/mole to about 400 g/mole, such as from about 280 g/mole to about 350 g/mole, for example about 300 g/mole to about 330 g/mole. Neopentyl glycol propoxylate diacrylate can be obtained as SR9003B from Sartomer Corporation or as Aldrich-412147 from Sigma Aldrich Corporation. Neopentyl glycol diacrylate is available as Aldrich-408255 from Sigma Aldrich Corporation.

Styrenic monomers that may be used include styrene and alkylated styrenes such as methyl- and ethyl-substituted styrenes with any number of substituents, divinylbenzene and alkylates thereof, styrene or divinylbenzene dimerized or oligomerized with other olefins and diolefins such as butadiene, acrylonitrile, and acrylates. Styrene can be dimerized or oligomerized with dienes such as butadiene, pentadiene, divinylbenzene, cyclopentadiene, norbornadiene, and the like, while divinylbenzene can be dimerized or oligomerized with olefins such as ethylene, propylene, styrene, acrylic compounds such as acrylonitrile, acrylic acids, acrylates, and other familiar olefins, and/or with dienes such as butadiene, pentadiene (isoprene, piperylene), hexadiene, cyclopentadiene, and norbornadiene.

The crosslinking agents are generally multifunctional vinylic monomers having at least three reactive carbon-carbon double bonds. Multifunctional acrylates that may be used as crosslinking agents include triacrylates, tetraacrylates, tri(meth)acrylates, and tetra(meth)acrylates. Representative examples of crosslinking agents include, but are not limited to, pentaerythritol tetraacrylate (PET), pentaerythritol tetra(meth)acrylate, di(trimethylolpropane) tetraacrylate, and di(trimethylolpropane) tetramethacrylate, ethylene glycol di-(meth) acrylate and derivatives, and methylenebisacrylamide and derivatives. While crosslinking agents sometimes form chemical bonds with other crosslinking agents in a spot of print material, crosslinking agents generally interconnect multiple chains of monomers to provide structural stability to a cured spot of print material.

Scattering materials in liquid or cured print material reflects and diffuses light passing through the print material. In the case of sub-regions of display pixels, scattering particles are employed to scatter the light emitting from a posterior light source as the light travels through the print material to promote absorption of the incident light by the quantum dots, and to promote scattering of emitted light and increase the field of view of the display. Because light scattering is a physical process, scattering particles work in both liquid and cured print material, so long as the print material is transparent to the light being scattered. Scattering particle performance is improved when scattering particles are evenly distributed throughout the print material. Thus, when a drop liquid print material having uniform distribution of scattering particles is deposited on a substrate top surface, curing conditions for the formed spot of print material are adjusted in order to preserve the distribution of scattering particles within the spot of print material after curing. Curing conditions that contribute to clumping, edge effects, or other uneven distribution of scattering particles and/or quantum dots in the spot of print material.

Scattering materials are small particles of inorganic materials such as titanium dioxide, zinc oxide, or other transition metal oxides. According to some embodiments, scattering particles in a print material on a display substrate have surface areas ranging from about 11 $m^2/g$ to about 18 $m^2/g$. According to some embodiments, scattering particles have a diameter ranging from about 30 nanometers to about 500 nanometers, although other particle diameters are envisioned within the scope of the present disclosure. In general, scattering particles have a white appearance in visible light because of a high particle albedo. Scattering particles also tend to be reflective of shorter wavelengths of light, such as ultraviolet light with wavelengths shorter than 400 nm. The efficiency with which scattering particles, and quantum dots, scatter and absorb incident UV light creates a challenge for curing the surrounding material at the same wavelength, as will be described below. According to some embodiments, an ultraviolet light source for performing a photo-initiated curing process includes one or more of the following light sources: an ultraviolet light emitting diode (ultraviolet LED, or UV LED), a mercury vapor lamp, a tungsten filament lamp, or other sources of ultraviolet light known in the art.

In some instances, print material includes a dispersant to reduce clumping, or flocculation, of suspended particles in the print material. Some dispersants tend to adhere to quantum dot particles. Some dispersants tend to adhere to scattering particles. Some dispersants merely reduce interaction of particles that would otherwise associate and/or flocculate. Dispersants are molecules with particle dispersing properties. In some cases, one end of the dispersant molecule is preferentially attracted to a particle, insulating the particle from interaction with other particles. In other cases, the dispersant molecule associates with the particle to maintain separation between particles, but with no preferred orientation. In still other cases, dispersant molecules merely occupy space and reduce mobility and interaction of particles. Some usable dispersants include cationic dispersants such as poly(oxyalkylene) phosphates.

According to some embodiments, dispersants comprise up to 10% by weight of the print material. According to some embodiments, print materials can contain up to 35% by weight of quantum dots and 10% by weight of scattering particles, for a total solids content up to 40% by weight. Some dispersant molecules may remain unreacted by polymerization reactions, forming a dispersant material residue mixed with the scattering particles and/or the quantum dots in a cured print material after curing is finished.

Figure 2A:
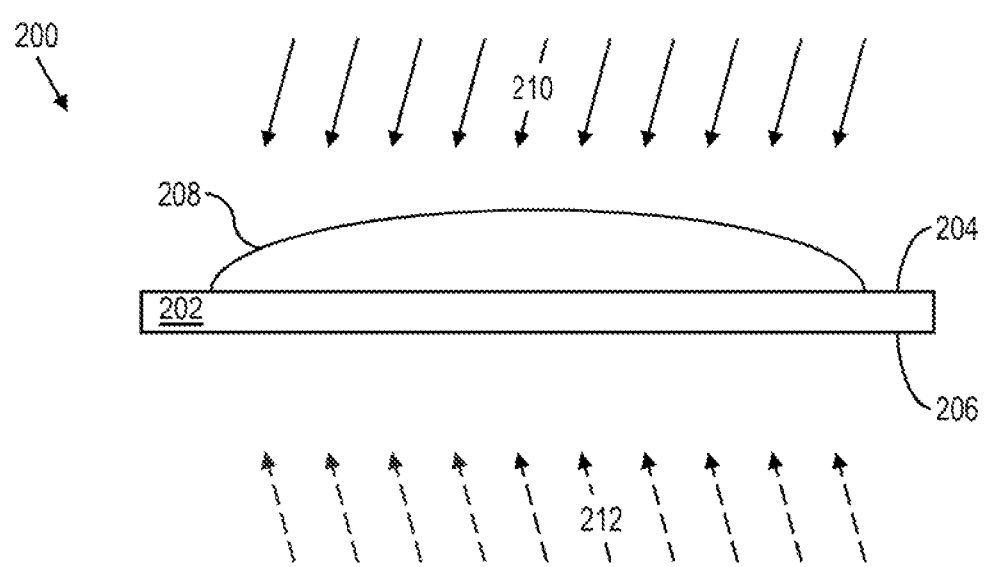
FIGS. 2A-2F are cross-sectional diagrams of a pixel sub-region during a manufacturing process, in accordance with some embodiments.

In an operation 110, the print material is deposited onto a display substrate. According to some embodiments, print material is deposited onto a display substrate using inkjet printing technologies. In some embodiments, an inkjet printer configured to deposit print material on a display substrate include an ink reservoir, and ink recirculation lines running between the reservoir and an ink dispenser, a print orifice and an actuator to allow print material, or ink, to enter the orifice for a predetermined amount of time to generate a drop of print material. When a drop of print material leaves the print orifice and lands on the display substrate, the drop should have sufficient volume to cover an area designated as a sub-region of a pixel without covering adjoining sub-regions in other pixels. A drop of print material, once on the top surface of the substrate, is a spot of print material In an optional operation 115, the print material undergoes a photo-curing process. FIG. 2A is a diagram of a pixel sub-region 200 during a manufacturing process, according to some embodiments. In FIG. 2A, substrate 202 has a top surface 204 and a bottom surface 206. Print material 208 is located on top surface 204 and has an initial mass. Print material covers an area designated for a pixel sub-region of a monitor or display, according to embodiments of computer monitors or displays described elsewhere in the present disclosure. After deposition, a print material includes numerous matrix monomers and cross-linking monomers, polymerization initiators, scattering particles, and quantum dots. In some embodiments, print material also includes a dispersant compound configured to reduce and/or prevent clumping, or flocculation, of scattering particles and quantum dots, especially as the concentration, or weight percent, of the scattering particles and quantum dots increases in the print material.

Subsequent to depositing liquid print material onto a top surface 204, the spot of liquid print material is cured in order to strengthen and promote adhesion of the cured print material to substrate top surface 204. According to some embodiments, the curing of print material 208 includes an initial photo-curing step, wherein topside illumination 210, and or backside illumination 212 is shown onto print material 208 to commence polymerization of the print material components. Backside illumination 212 is omitted in some embodiments of the method when the substrate 202 is opaque or substantially non-transmissive to the wavelength of illumination. Substrates that are transparent to visible light and opaque to ultraviolet light receive topside illumination using a wavelength appropriate for initializing polymerization, but do not receive backside illumination 212 because the substrate blocks transmission of UV light to the liquid print material 208 on the top surface. According to some embodiments of curing processes, light is shone with constant intensity on the printed substrate. In some curing methods, the incident light for curing is pulsed, according to a predetermined pattern to preserve a substrate (or, print material) temperature within a predetermined temperature range. In some curing methods, light is pulsed on the substrate from both the top side and the bottom side of the substrate at the same time to promote uniform curing of top and bottom portions of the spot of print material. In some instances, pulsed light for curing the print material is pulsed alternating between the top and bottom sides of the substrate (or, print material) in order to cure one side of the spot of print material while allowing the other side of the spot to relax from a prior exposure of light to alleviate strain in the spot of printed material.

According to some methods of curing print materials for making quantum dot materials, photo-curing and thermal curing are performed separately. In some embodiments of manufacturing methods, the photo-curing and thermal curing are performed in parallel. Some curing methods involve pulsed (e.g., ultraviolet) illumination at constant curing temperatures above a threshold of activation of a polymerization initiator that has a high thermal decomposition rate. Some methods of curing involve holding the substrate bearing the print material at multiple temperatures during the curing process. Some methods involve a short (e.g., <5 minutes) exposure to a high initial curing temperature followed by a long (e.g., >60 minutes) exposure to a lower curing temperature to complete a thermal curing process. In some instances, the rates of polymerization of mixtures of monomers is varied according to illumination profiles with variable intensity and duration during the curing process. In some instances, the photo-curing process occurs during a temperature ramp-up phase of a curing process, and photo-curing is halted while a thermal-curing process above a threshold of activation of the thermal polymerization initiator occurs.

Photo-curing and thermal curing processes may be enhanced by using polymerization initiators suited to photo or thermal curing processes. For example, a photo-curing process may be enhanced by using a polymerization initiator whose highest decomposition rate is achieved through photo stimulus, while a thermal curing process may be enhanced by using a polymerization initiator whose highest decomposition rate is achieved through thermal stimulus. Thus, a polymerization initiator with a photo-initiated decomposition rate higher than a peak thermal decomposition rate during a curing process is called a photoinitiator. Likewise, a polymerization initiator with a thermal decomposition rate higher than a peak photo-initiated decomposition rate may be referred to as a thermal initiator. In this regard, a peak thermal decomposition rate is the highest decomposition rate achieved by the compound in a relevant temperature range of a curing process absent significant photonic stimulus. Likewise, a peak photo-initiated decomposition rate is the highest decomposition rate of a curing process achieved by the compound using photonic stimulus in a relevant spectrum absent significant thermal stimulus.

During some embodiments of the method 100, operation 115 proceeds using an ultraviolet light source. According to some embodiments, the ultraviolet dose during an exposure ranges from 1.5 J/cm2 to 6 J/cm2. According to some embodiments, volumes of print material on a substrate are exposed to the above-mentioned ultraviolet doses for periods up to 10 minutes in order to promote curing of print material without loss of print material monomers due to heating. Ultraviolet dosages are generally used that are sufficient to initiate, but not complete, photo-curing of the deposited print material. The dosages used generally form oligomers within the print material. When liquid print material has a range of thickness between 10 and 20 μm on a top surface of a display substrate within a pixel sub-region, the curing time is extended to allow for more polymerization to occur. In some cases, cured print material has a spot thickness ranging from about 0.5 to about 4 μm. Also, in these methods, the mass of a cured print material on a substrate is at least 80% of the initial mass of print material on the substrate, such as at least 85% of the initial mass, for example at least 90% of the initial mass. In some cases, the volume of a cured print material is at least 90% of the volume of liquid print material prior to performing the curing process on the print material.

According to some embodiments of a photo-curing process, the rate of curing is influenced by the amount of polymerization initiator present in wet print material. For embodiments of print material described herein, a range of polymerization initiator present in print material ranges from about 0.1 weight percent to about 10 weight percent of the print material prior to deposition upon the substrate top surface. According to some embodiments, photo-curing processes proceed with a substrate temperature ranging from 50° C. to 90° C. for periods up to 30 minutes.

Figure 2B:
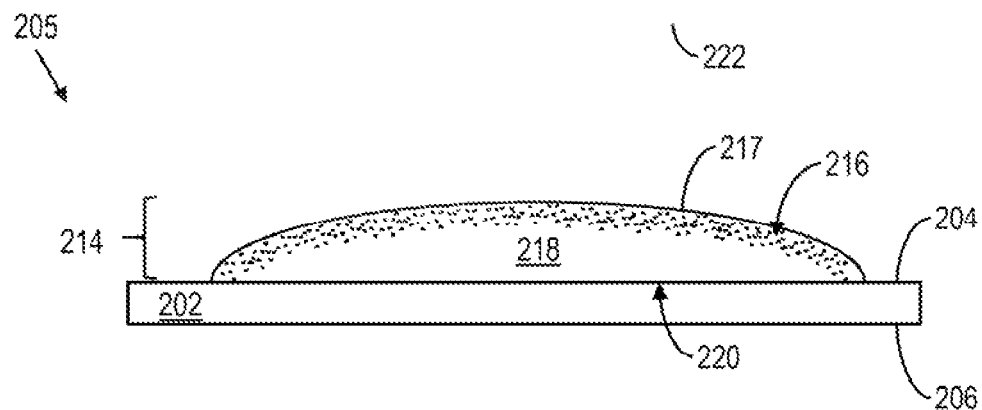

According to present understanding, photo-curing of a print material containing quantum dots, scattering particles, matrix monomers, and cross-linking polymers occurs to a larger extent in a surface region of the volume of print material, although some polymerization also occurs at an inner region of the spot. FIG. 2B is a cross-sectional diagram of a pixel subregion 205 during a manufacturing process after a photo-curing process, such as the photo-curing process described in optional operation 110, takes place. Substrate 202 has partially cured print material 214 on top surface 204. Both outer portion 216 and outer portion 218 of partially cured print material 214 have undergone some polymerization. Inner portion 218 of partially cured print material 214 is has a lesser amount of polymerization, and a lower concentration of oligomers, than outer portion 216 of the print material. Outer portion 216, including top surface 217, of partially cured print material 214 contains oligomers that increase the average molecular weight of the partially cured print material 214 and reduce the overall vapor pressure thereof. By increasing the average molecular weight of the print material during a photo-curing process, the loss of polymerization monomers is reduced because there is somewhat less available monomer to escape the partially-cured print material 214, and because the vapor pressure of the material is reduced. Outer portion 216 exhibits a gradient of oligomer formation from top surface 217, which absorbs more activating radiation, down to inner portion 218 and to surface 220 of the substrate, which receive less activating radiation. In some embodiments, the outer portion 216 extends along top surface 217 and down to surface 220 of the substrate, and inner portion 218 extends along middle portion of the interface between print material 214 and surface 220. In some embodiments, the local amount of polymerized material decreases to less than approximately 5% of the total material in the inner region. The steepness of the concentration gradient of oligomer through partially-cured print material 214 depends on the transmissivity of the print material to the photons that trigger the photo-curing.

Figure 2C:
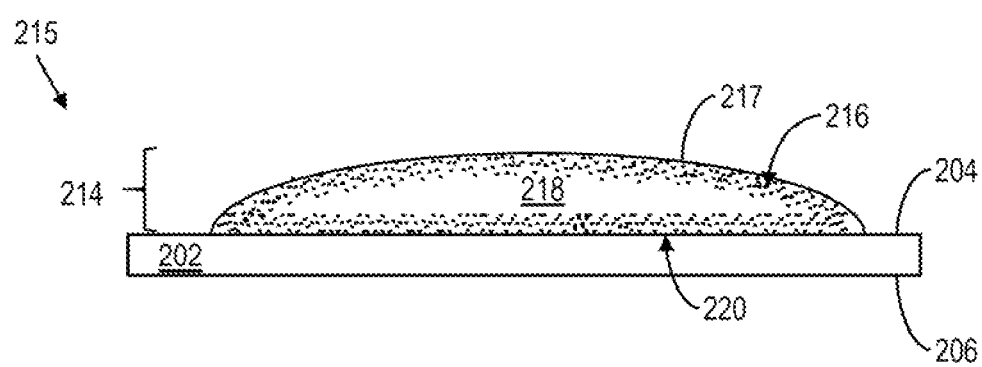

FIG. 2C is a cross-sectional view of a pixel sub-region 215 during a manufacturing process, where substrate 202 is transparent to ultraviolet light and back side illumination (see FIG. 2A, element 212) has been used to process the print material through the substrate 202. In FIG. 2C, inner portion 218 is smaller than in FIG. 2B because outer portion 216, containing oligomers and partially polymerized print material 214, extends around an entirety of the inner portion 218. Thus, the concentration gradient of oligomers extends in toward inner portion 218 from all sides, not just from the top surface 217.

Figure 2D:
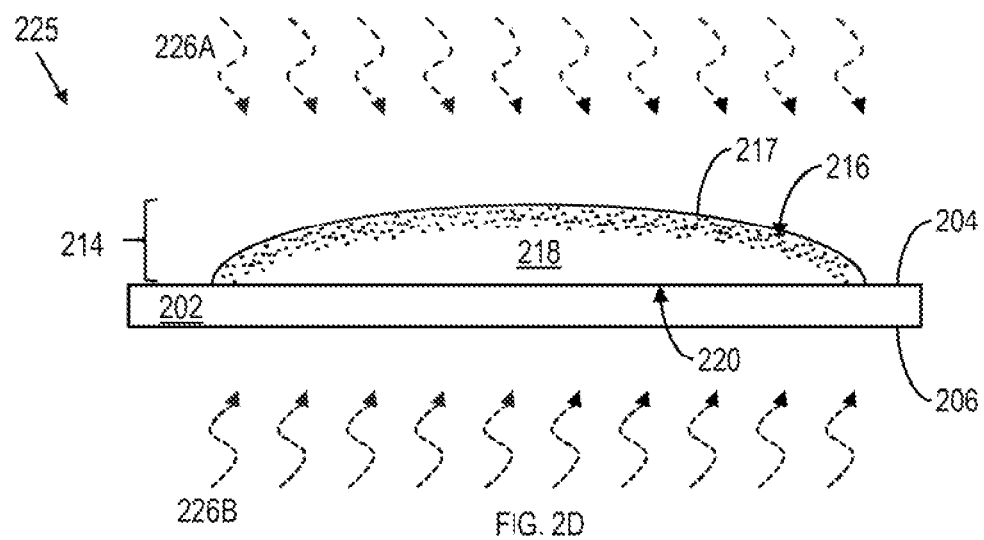
Figure 2E:
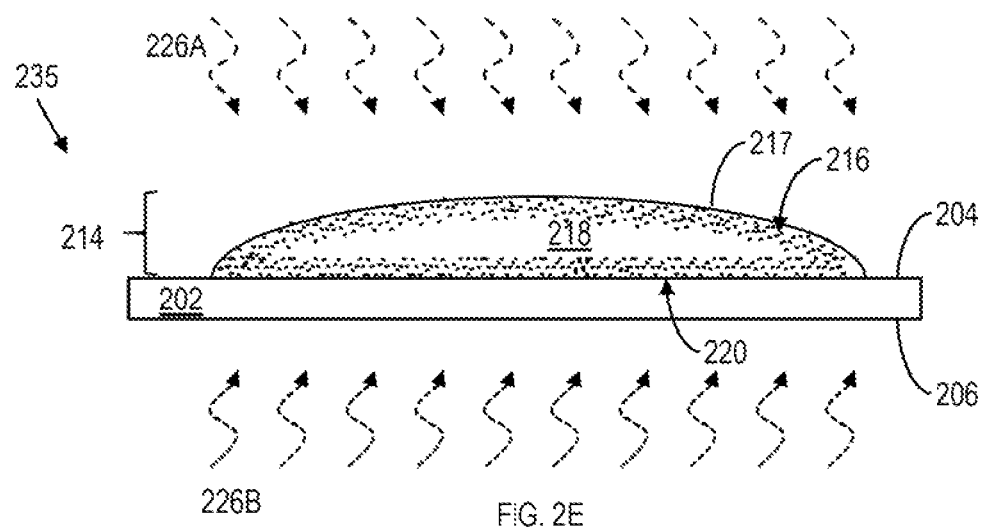

In an operation 120, the print material undergoes a thermal curing process, according to some embodiments. FIG. 2D is a cross-sectional view of a print material 225 undergoing a first version of operation 120. FIG. 2E is a cross-sectional view of a print material 235 undergoing a second version of operation 120. In FIGS. 2D and 2E, numerals describe elements similar to those in FIGS. 2B and 2C described previously. During operation 120, a thermal curing process is performed by providing thermal stimulation to the print material. Thermal stimulation is applied to a print material without any prior polymerization. Alternately, thermal stimulation may be applied to a print material after an initial photostimulation. Thermal stimulation may be topside stimulation 226A and/or backside stimulation 226B. Backside stimulation may occur by placing a substrate directly on a heated element that transmits heat directly into a substrate, and through the substrate into the partially cured print material, or by illuminating the substrate with thermal radiation using, for example, a heat lamp. Topside stimulation may occur by placing a heat lamp or other source of thermal radiation, such as a thermal radiator, in proximity to the partially cured print material 214.

In FIGS. 2D and 2E, the partially cured print material 214 has an increased higher molecular weight due to the partial curing of operation 115. The higher molecular weight increases vapor pressure of the print material 214 during thermal curing, reducing evaporative loss. By reducing loss of monomers from partially-cured print material 214, the concentration of quantum dots within the print material remains below a threshold concentration for the quantum dots. Further, reducing the rate of loss of monomers and/or other volatile components increases uniformity of cured volumes, improving uniformity of light emission by the cured material. Here, the outer portion 216 may have higher average molecular weight than the inner portion 218 due to higher absorption of activating radiation in the outer portion 216 during the partial curing operation 115.

Figure 2F:
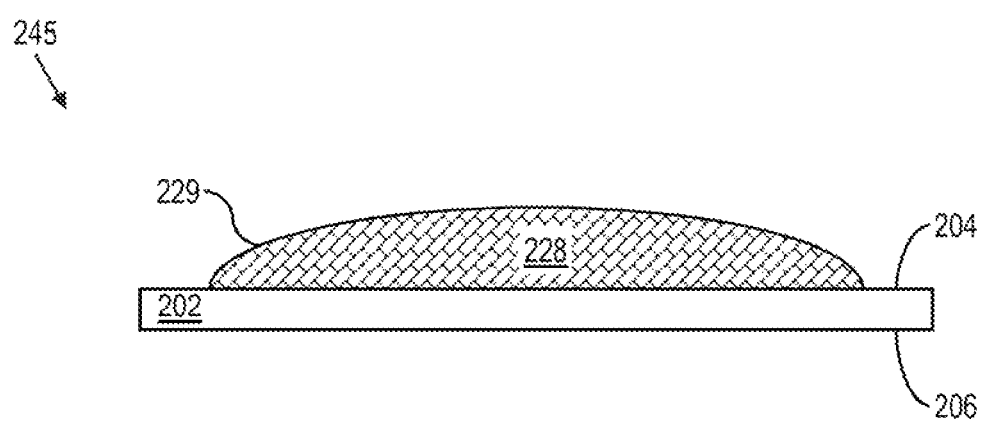

In an operation 125, the cured print material undergoes an evaluation process, according to some embodiments. FIG. 2F is a cross-section of a cured element 245, according to some embodiments. Numerals in FIG. 2F that are common to elements also shown in FIGS. 2A-2E describe the same element. Cured print material 228 has completed polymerization. In some embodiments, cured print material 228 has achieved over 90% polymerization, with some residual matrix monomers or cross-linking monomers remaining. Cured print material 228 has a cured mass that is at least 80% of an initial mass of the print material. In some embodiments, subsequent to performing the operations of method 100, mass of the cured print material 228 is at least 85% of the initial mass of print material 208, for example at least 90% of the initial mass, on the substrate 202.

The materials described herein can be deposited onto a substrate using an inkjet printer such as those available from Kateeva, Inc., of Newark, California. Inkjet printers available from other manufacturers can also be used. The photo-curing and thermal curing processes can be performed using photo-curing and thermal curing chambers available from Kateeva, Inc., as well as chambers available from other manufacturers. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A print material, comprising:
   a curable material;
   scattering particles;
   quantum dots;
   a first polymerization initiator; and
   a second polymerization initiator, wherein during a first curing process the first polymerization initiator has a higher decomposition rate than the second polymerization initiator, and during a second curing process the second polymerization initiator has a higher decomposition rate than the first polymerization initiator.

2. The print material of claim 1, wherein the first curing process is a photo-curing process and the second curing process is a thermal curing process.

3. The print material of claim 1, wherein the curable material includes at least one tetrafunctional cross-linker.

4. The print material of claim 1, wherein the curable material comprises pentaerythritol tetraacrylate.

5. The print material of claim 1, wherein the scattering particles are titanium dioxide particles.

6. The print material of claim 1, wherein
   the scattering particles are 0.1-10 weight percent of a total weight of the print material; and
   the quantum dots are 10-35 weight percent of the total weight.

7. The print material of claim 1, further comprising a (poly)alkylene phosphate dispersant material.

8. The print material of claim 1, wherein the first polymerization initiator is selected from the group consisting of AIBN, AICN, t amyl peroxybenzoate, t-butyl peracetate, t-butyl peroxybenzoate, 2,2 bis(t-butylperoxy)butane, and 2,4 pentanedione peroxide.

9. The print material of claim 1, wherein the quantum dots are selected from the group consisting of group IV semiconductor materials, Group III-V semiconductor compounds, Group II-VI semiconductor compounds, and perovskite compounds.

10. A cured print material comprising a product of curing a print material that comprises:
    a curable material;
    scattering particles;
    quantum dots;
    a first polymerization initiator; and
    a second polymerization initiator, wherein during a first curing process the first polymerization initiator has a higher decomposition rate than the second polymerization initiator, and during a second curing process the second polymerization initiator has a higher decomposition rate than the first polymerization initiator.

11. The cured print material of claim 10, wherein the print material is configured such that, after the first curing process and the second curing process, the material resulting from the first curing process and the second curing process transmits light.

12. The cured print material of claim 10, wherein the curable material includes at least one tetrafunctional cross-linker.

13. The cured print material of claim 12, wherein the curable material comprises pentaerythritol tetraacrylate.

14. The cured print material of claim 10, wherein the scattering particles are titanium dioxide particles.

15. The cured print material of claim 10, wherein
the scattering particles are 0.1-10 weight percent of a total weight of the print material; and
the quantum dots are 10-35 weight percent of the total weight.

16. The cured print material of claim 10, wherein the print material further comprises a (poly)alkylene phosphate dispersant material.

17. The print material of claim 10, wherein the first polymerization initiator is selected from the group consisting of AIBN, AICN, t amyl peroxybenzoate, t-butyl peracetate, t-butyl peroxybenzoate, 2,2 bis(t-butylperoxy)butane, and 2,4 pentanedione peroxide.

18. The print material of claim 10, wherein the quantum dots are selected from the group consisting of group IV semiconductor materials, Group III-V semiconductor compounds, Group II-VI semiconductor compounds, and perovskite compounds.

19. A cured print material comprising a product of curing a print material using a photo-curing process and a thermal curing process, the print material comprising:
a curable material;
a scattering material;
quantum dots;
a first polymerization initiator; and
a second polymerization initiator, wherein during the photo-curing process the first polymerization initiator has a higher decomposition rate than the second polymerization initiator, and during the thermal curing process the second polymerization initiator has a higher decomposition rate than the first polymerization initiator.

20. A display device comprising the cured print material of claim 19.

* * * * *